United States Patent [19]

Sharp, III et al.

[11] Patent Number: 5,501,076
[45] Date of Patent: *Mar. 26, 1996

[54] COMPACT THERMOELECTRIC REFRIGERATOR AND MODULE

[75] Inventors: Charles A. Sharp, III; Michael J. Doke, both of Dallas; Richard A. Howarth, Allen; Leonard J. Recine, Sr., Plano, all of Tex.

[73] Assignee: Marlow Industries, Inc., Dallas, Tex.

[ * ] Notice: The portion of the term of this patent shall not extend beyond the expiration date of Pat. No. 5,315,830.

[21] Appl. No.: 344,140

[22] Filed: Nov. 23, 1994

Related U.S. Application Data

[63] Continuation-in-part of Ser. No. 146,712, Nov. 1, 1993, Pat. No. 5,367,879, which is a continuation-in-part of Ser. No. 47,695, Apr. 14, 1993, Pat. No. 5,315,830.

[51] Int. Cl.⁶ .................................................. F25B 21/02
[52] U.S. Cl. .................... 62/3.6; 62/3.2; 62/440; 62/429
[58] Field of Search ........................... 62/3.2, 3.3, 3.6, 62/3.62, 3.7, 457.1, 457.2, 457.9, 440, 404, 419, 428, 429

[56] References Cited

U.S. PATENT DOCUMENTS

| | | | |
|---|---|---|---|
| 2,837,899 | 6/1958 | Lindenblad | 62/1 |
| 2,872,788 | 2/1959 | Lindenblad | 62/3 |
| 2,932,953 | 4/1960 | Becket et al. | 62/3 |
| 3,048,020 | 8/1962 | Jones | 62/3.64 |
| 3,077,079 | 2/1963 | Pietsch . | |
| 3,177,670 | 4/1965 | Boehmer et al. | 62/3 |
| 3,177,671 | 4/1965 | Stambaugh | 62/3 |
| 3,280,573 | 10/1966 | Brown et al. | 62/3 |
| 3,823,567 | 7/1974 | Corini | 62/3 |
| 4,007,600 | 2/1977 | Simms | 62/3 |
| 4,326,383 | 4/1982 | Reed et al. | 62/3.2 |
| 4,328,676 | 5/1982 | Reed | 62/3 |
| 4,346,562 | 8/1982 | Beitner | 62/3 |
| 4,472,945 | 9/1984 | Cech et al. | 62/3.3 |
| 4,627,242 | 12/1986 | Beitner | 62/3.2 |
| 4,644,753 | 2/1987 | Burke | 62/3 |
| 4,662,180 | 5/1987 | Menocal | 62/3 |
| 4,726,193 | 2/1988 | Burke et al. | 62/3 |
| 4,744,220 | 5/1988 | Kerner et al. | 62/3 |

(List continued on next page.)

FOREIGN PATENT DOCUMENTS

| | | | |
|---|---|---|---|
| 0627705 | 3/1992 | Australia | F25B 21/02 |
| 0342165 | 11/1989 | European Pat. Off. | F25B 21/02 |
| 1125957 | 3/1962 | Germany | 62/3.64 |
| 1198837 | 8/1965 | Germany | 62/3.7 |
| 320580A | 1/1991 | Japan | 62/3.2 |
| 8101739 | 6/1981 | WIPO | 62/3.6 |
| 8504948 | 11/1985 | WIPO | 62/3.6 |

OTHER PUBLICATIONS

"A New Scientific Development in Refrigeration" *Electric & Gas Technology, Inc.*

Primary Examiner—John M. Sollecito
Attorney, Agent, or Firm—Baker & Botts

[57] ABSTRACT

A module for controlling the temperature within an enclosed structure is provided. The module comprises a thermoelectric assembly, a platform, and a panel. The thermoelectric assembly comprises a thermoelectric device with a first heat sink disposed on one side of the device and a second heat sink disposed on the other side of the device. The thermoelectric assembly further comprises an electric motor attached to one of the heat sinks with a rotating shaft extending longitudinally through the electrical motor and both heat sinks. A propeller may be attached to each end of the rotating shaft adjacent to the first heat sink and the second heat sink respectively. The platform may be removably engaged with the enclosed structure. A first fastener may be used to attach the thermoelectric assembly to the platform. A first opening may be provided in the platform adjacent to one of the propellers. The panel preferably attaches to the platform for use in mounting and sealing the thermoelectric module within the enclosed structure.

22 Claims, 4 Drawing Sheets

U.S. PATENT DOCUMENTS

| | | | |
|---|---|---|---|
| 4,833,888 | 5/1989 | Kerner et al. | 62/3.3 |
| 4,934,150 | 6/1990 | Fessler | 62/139 |
| 5,029,446 | 7/1991 | Suzuki | 62/3.6 |
| 5,168,339 | 12/1992 | Yokotani et al. | 257/64 |
| 5,209,069 | 5/1993 | Newman | 62/3.64 |
| 5,301,508 | 4/1994 | Kahl et al. | 62/3.2 |
| 5,315,830 | 5/1994 | Doke et al. | 62/3.2 |

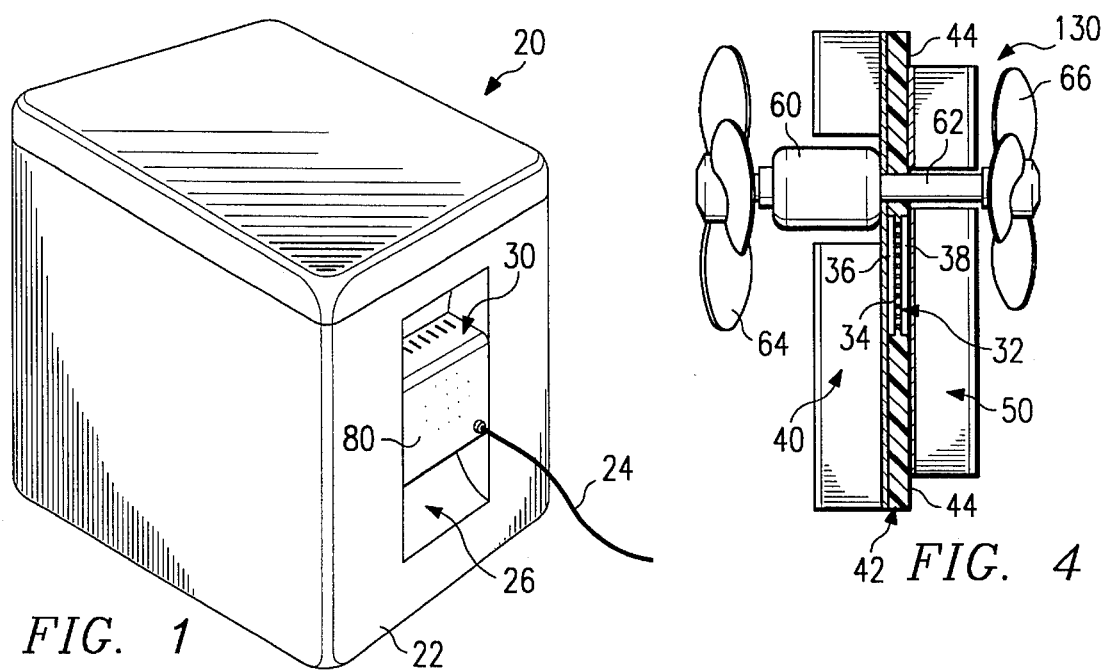
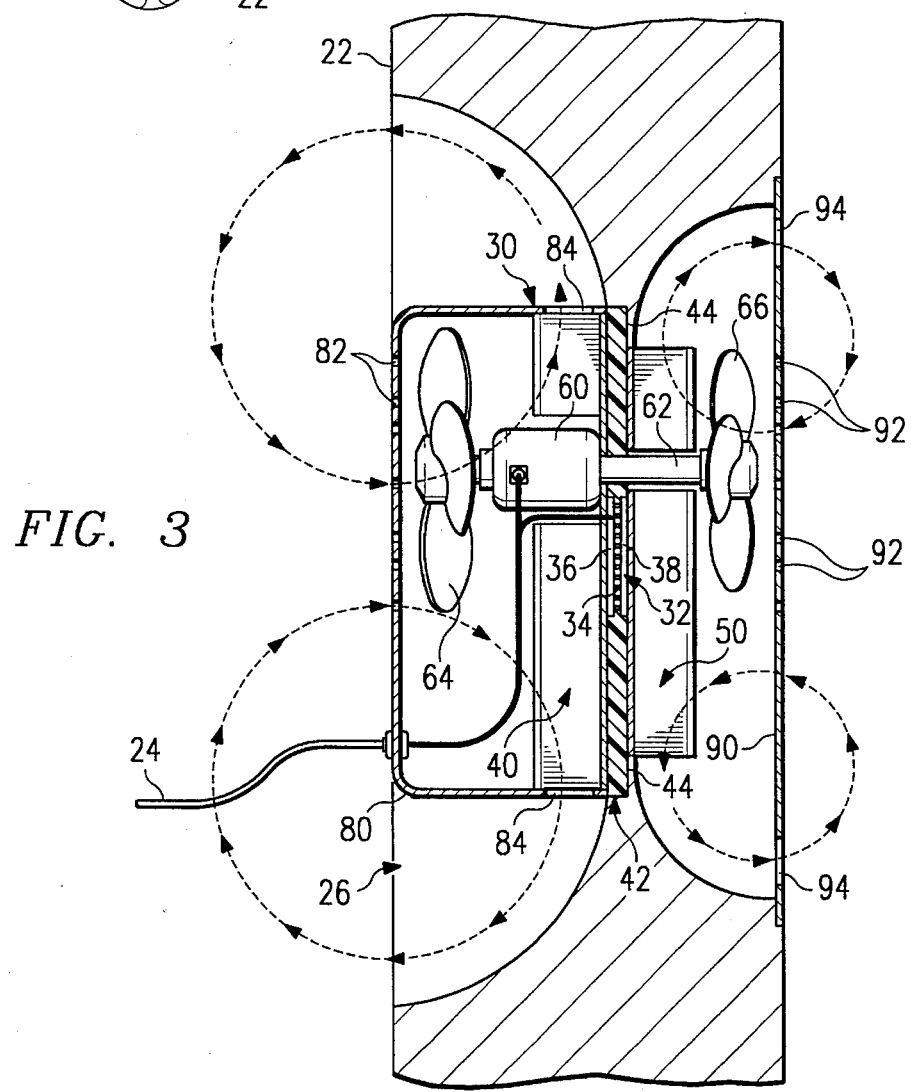

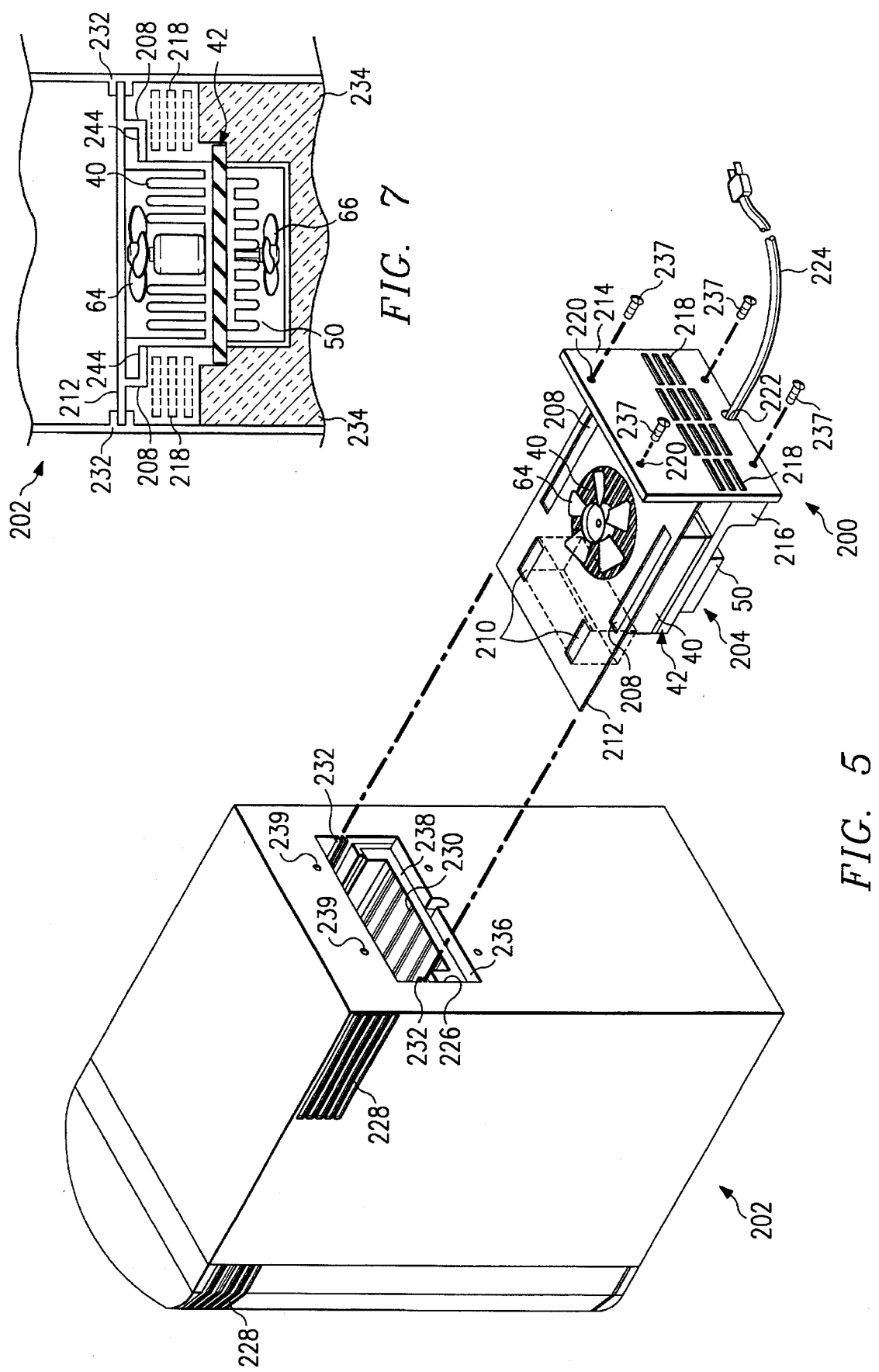

COMPACT THERMOELECTRIC REFRIGERATOR AND MODULE

RELATED APPLICATION

This is a continuation-in-part of pending patent application Ser. No. 08/146,712 filed Nov. 1, 1993, entitled Modular Thermoelectric Cooler, now U.S. Pat. No. 5,367,879, which is a continuation-in-part of patent application Ser. No. 08/047,695 filed Apr. 14, 1993, entitled *Modular Thermoelectric Assembly* of same assignee now U.S. Pat. No. 5,315,830.

TECHNICAL FIELD OF THE INVENTION

This invention relates to thermoelectric devices and more particularly to the use of a thermoelectric module to maintain the temperature of a container, box, or any other type of enclosed structure within a desired temperature range.

BACKGROUND OF THE INVENTION

The basic theory and operation of thermoelectric devices has been developed for many years. Modern thermoelectric devices typically include an array of thermocouples which operate by using the Peltier effect. Thermoelectric devices are essentially small heat pumps which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components.

When DC electrical power is applied to a thermoelectric device having an array of thermocouples, heat is absorbed on the cold side of the thermocouples and passes through the thermocouples and is dissipated on the hot side of the thermocouples. A heat sink (sometimes referred to as the "hot sink") is preferably attached to the hot side of the thermoelectric device to aid in dissipating heat from the thermocouples to the adjacent environment. In a similar manner a heat sink (sometimes referred to as a "cold sink") is often attached to the cold side of the thermoelectric device to aid in removing heat from the adjacent environment. Thermoelectric devices are sometimes referred to as thermoelectric coolers. However, since they are a type of heat pump, thermoelectric devices can function as either a cooler or a heater.

There are a wide variety of containers and enclosed structures which are designed to be maintained within a selected temperature range. Examples of such containers and enclosed structures include, but are not limited to, "ice chests", picnic coolers, cabinets containing sensitive electronic equipment, and organ transplant containers. The use of thermoelectric devices which operate on a 12-volt DC system are well known to maintain desired operating temperatures in portable refrigerators or cooler associated with various types of motor vehicles. An example of a container having a thermoelectric cooler is shown in U.S. Pat. No. 4,726,193 entitled "Temperature Controlled Picnic Box". This patent is incorporated by reference for all purposes within this application.

Previously developed enclosed structures include thermoelectric refrigerators. Due to difficulties in achieving a sufficient seal between the enclosed structure and apparatus contained therein for thermoelectric cooling, previously developed thermoelectric refrigerators often are difficult to assemble and test. Often the location of the thermoelectric apparatus within the refrigerator prevented the use of efficient manufacturing and assembly techniques. In addition, if the thermoelectric apparatus malfunctions, it may be expensive and time consuming to repair or replace.

SUMMARY OF THE INVENTION

In accordance with the present invention, disadvantages and problems associated with previous thermoelectric assemblies used to maintain selected temperatures in an enclosed structure or container have been substantially reduced or eliminated.

One aspect of the present invention includes a thermoelectric module for controlling the temperature within an enclosed structure. The module comprises a thermoelectric assembly, platform, and panel. The thermoelectric assembly comprises a thermoelectric device having a first heat sink secured to one side of the thermoelectric device and a second heat sink secured to the other side of the thermoelectric device. An electrical motor may be secured to either heat sink with a rotating shaft extending longitudinally through the electrical motor and both heat sinks. Propellers are provided on each end of the rotating shaft adjacent to the heat sinks. The platform may be removably engaged with the enclosed structure. A first fastener may be used to attach the thermoelectric assembly to the platform. A first opening may be provided in the platform adjacent to one of the propellers. The panel is preferably attached to the platform for use in mounting and sealing the thermoelectric module with the enclosed structure.

Important technical advantages of the present invention include that the thermoelectric module is easy to assemble. Similarly, the module may easily be connected to an enclosed structure. The module may also easily be removed for repair or replacement should it malfunction. The enclosed structure in which the module is placed, such as, for example, a thermoelectric refrigerator, is easy to assemble because of the modular design of the present invention. The module also may be assembled and tested prior to insertion into the enclosed structure. In this way, a manufacturer need not assemble an entire refrigerator before testing the thermoelectric assembly for defects. The enclosed structure can also be assembled in a different location than the thermoelectric module, given the ease of testing the module. The present invention may thus reduce labor costs and/or scrap costs that may be incurred in assembling more complicated enclosed structures and/or thermoelectric assemblies.

Another advantage of the thermoelectric module is that it can be used for both heating and cooling an enclosed structure. Although the illustrated embodiment may be advantageously used in a thermoelectric refrigerator, it could also be used in a thermoelectric heater or oven.

Other technical advantages of the disclosed invention will be apparent to those skilled in the art.

BRIEF DESCRIPTION OF THE DRAWINGS

For a more complete understanding of the present invention, and the advantages thereof, reference is now made to the following written description taken in conjunction with the accompanying drawings, in which:

FIG. 1 is an isometric drawing of a container or enclosed structure having an embodiment of a thermoelectric assembly incorporating the present invention;

FIG. 3 is a schematic drawing in section and in elevation with portions broken away, showing the thermoelectric assembly of FIG. 2 with the preferred air flow paths;

FIG. 4 is a drawing in elevation and in section showing a thermoelectric assembly incorporating the present invention;

FIG. 5 illustrates an exploded perspective view of a second embodiment of a module for controlling the temperature within an enclosed structure constructed in accordance with the teachings of the present invention and a thermoelectric refrigerator constructed in accordance with the teachings of the present invention;

FIG. 7 illustrates a cross-sectional end view of the module of FIG. 5 inserted into the thermoelectric refrigerator of FIG. 5.

DETAILED DESCRIPTION OF THE INVENTION

Figure 2:
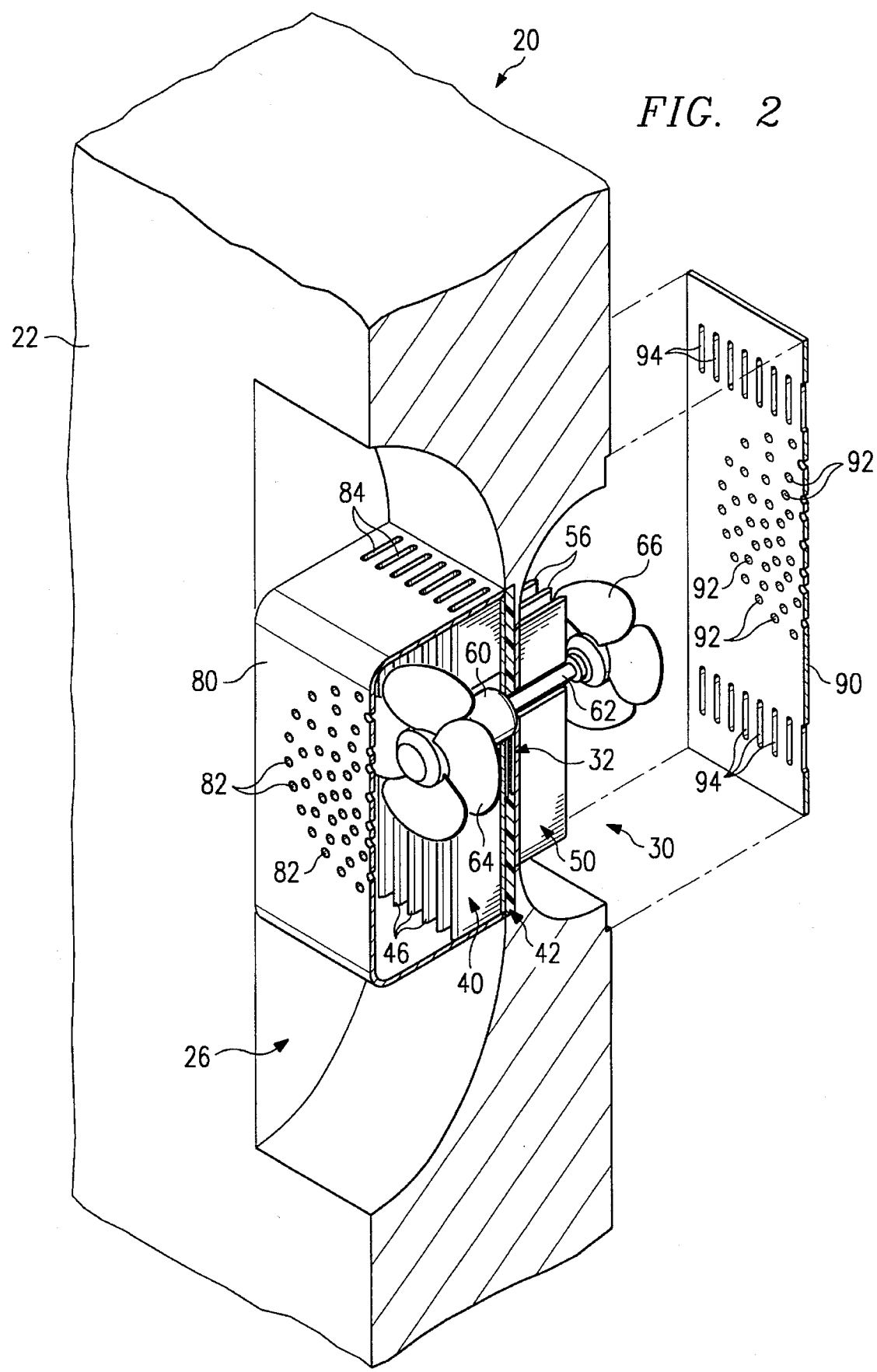
FIG. 2 is an enlarged isometric drawing, in section and in elevation with portions broken away, of the thermoelectric assembly and container of FIG. 1.

The preferred embodiments of the present invention and its advantages are best understood by referring to FIGS. 1 through 8 of the drawings, like numerals being used for like and corresponding parts of the various drawings.

As shown in FIG. 1, container or enclosed structure 20 includes modular thermoelectric assembly 30 disposed within end 22 of container 20. Container 20 could be any type of enclosed structure such as an ice chest, picnic cooler, cabinet for electronic equipment, pharmaceutical storage, organ transplant container, etc. Container 20 may be a permanently mounted enclosure in a building or in a motor vehicle such as an automobile or airplane, or a hand carried portable container. An important feature of the present invention is the ability to modify thermoelectric assembly 30 for use with any type of enclosed structure or container.

Thermoelectric assembly 30 includes thermoelectric device 32 with first heat sink 40 and second heat sink 50 disposed on opposite sides thereof. Thermoelectric device 32 preferably includes a plurality of thermocouples or thermoelectric elements 34 disposed between thermally conductive plates 36 and 38. For some applications, plates 36 and 38 may be formed from ceramic and/or composite materials as desired. Thermoelectric elements 34 may be selected from materials such as bismuth telluride to provide an array of P-N junctions with the desired thermoelectric characteristics to allow thermoelectric device 32 to function as a heat pump.

Thermoelectric elements 34 are preferably connected electrically in series and thermally in parallel by plates 36 and 38. Conductor or electrical power cord 24 is provided to supply electrical energy from a 12 volt DC power supply (not shown). The power supply can be a battery, DC power generator, AC/DC converter, or any other appropriate source of DC electrical power. When DC electrical power is supplied to thermoelectric device 32, heat is absorbed on the cold side represented by plate 38 and passes through thermoelectric elements or thermocouples 34 and is dissipated on the hot side at plate 36.

The efficiency of thermoelectric device 32 is substantially improved by attaching first heat sink 40 to hot plate 36 and second heat sink 50 to cold plate 38. Since heat sink 40 is attached to hot plate 36, it is sometimes referred to as the hot sink. In the same manner, since heat sink 50 is attached to cold plate 38, it is sometimes referred to as the cold sink. Appropriate bonding techniques such as soldering (not shown) may be used to assemble ceramic plates 36 and 38 with thermoelectric elements 34 disposed therebetween. Appropriately sized bolts and screws (not shown) may be used to assemble heat sinks 40 and 50 with thermoelectric device 32 disposed therebetween.

Heat sinks 40 and 50 are shown as fin type heat exchangers extruded as a single unit from appropriate material such as aluminum or copper. Heat sinks 40 and 50 could be manufactured from other types of material having the desired thermal conductivity and strength characteristics. In addition, other heat exchangers designs such as pin fin, slotted fin heat or fin welded heat sinks could be used in place of the single unit extruded heat sinks shown in FIGS. 2, 3 and 4.

Layer 42 of appropriate insulating material such as neoprene foam, polystyrene, polyurethane or cork is disposed between heat sinks 40 and 50. For many applications, neoprene foam is the preferred material for insulating layer 42. Heat sink 40 and insulating layer 42 cooperate to provide means for installing modular thermoelectric assembly 30 within an appropriately sized opening into enclosed structure 20. Since heat sink 40 is generally designed to have a larger surface area than cold sink 50, portion 44 of insulating material 42 extends beyond the periphery of heat sink 50 to form a flange suitable for engagement with opening 26 in container 20.

Heat sink 40 insulating layer 42 and heat sink 50 are shown in FIGS. 1 through 4 as having a generally rectangular cross-section. Opening 26 which extends through end 22 of container 20 includes a similar rectangular configuration for engagement with portion 44 on the periphery of insulating material 42. An important feature of the present invention is that heat sink 40, insulating layer 42 and heat sink 50 may be modified to have any geometric configuration such as circular, oval or triangular as appropriate for the specific container or enclosed structure in which modular thermoelectric assembly 30 will be installed.

The present invention allows optimizing the geometric configuration of the thermoelectric assembly to reduce costs of installation within a selected container or enclosed structure while at the same time enhancing the cooling/heating efficiency of thermoelectric device 32. The present invention allows maximizing the efficiency of the hot sink and/or the cold sink depending upon the application in which the thermoelectric assembly will be used. For some applications, hot sink 40 may be positioned within the enclosed structure and cold sink 50 on the exterior. For other applications, the polarity of the electrical power supplied to thermoelectric device 32 may be reversed to reverse the function of hot sink 40 and cold sink 50. Therefore, a thermoelectric assembly incorporating the present invention may be installed into an enclosed structure or container without having access to the interior of the enclosed structure or container to either cool or heat the interior.

Heat sink 40 and insulating layer 42 cooperate to function as structural support for thermoelectric assembly 30 within opening 26. Insulating layer 42 also functions as a gasket to form a fluid barrier between heat sink 40 and opening 26. Insulating layer 42 also provides a vapor barrier to block opening 26 and prevent undesired air flow therethrough.

Electrical motor 60 is preferably secured to first heat sink 40. Electrical conductor 24 is used to supply power to electrical motor 60. Rotating shaft 62 preferably extends through electrical motor 60, heat sink 40, insulating layer 42 and heat sink 50. Seals (not shown) may be provided between the exterior of rotating shaft 62 and the adjacent portions of insulating layer 42 to prevent undesired air flow along shaft 62. Propeller 64 is attached to the end of rotating shaft 62 extending from heat sink 40. Propeller 66 is attached to the other end of shaft 62 extending from heat sink 50. By positioning propeller 64 adjacent to its associated heat sink 40 and propeller 66 adjacent to its associated heat sink 50, the circulation of air over the respective heat sinks is substantially increased which results in improved efficiency of heat sinks 40, 50 and thermoelectric device 32.

In the embodiment illustrated in FIGS. 1–4, electrical motor 60 may be secured to first heat sink 40 by forming a recess in heat sink 40. For example, the fins of heat sink 40 may be milled to form a recess for the motor. As an alternative, a different type of electrical motor 60 could be used that may avoid the need to form a large recess for the motor. Electrical motor 60 could have the propeller surrounding the motor housing itself. This type of motor is commonly used in the design of a muffin fan. With the alternative choice for electrical motor 60, a smaller recess could be used that may only accomodate rotating shaft 62. Accordingly, because a smaller recess in heat sink 40 may reduce manufacturing costs, the alternative choice for electrical motor 60 may reduce the overall cost of thermoelectric assembly 30. A smaller recess that need only be large enough to accomodate rotating shaft 62 would also increase the available surface area of heat sink 40, increasing its cooling capacity, or a smaller heat sink 40 could possibly be used.

Modular thermoelectric assembly 30 preferably includes cover 80 attached to heat sink 40 and cover 90 disposed over heat sink 50. A plurality of holes 82 are provided in the center of cover 80 and a plurality of holes 92 are provided in the center of cover 90. Holes 82 and holes 92 can also be, for example, slots. A plurality of longitudinal slots 84 are provided at each end of cover 80 on opposite sides of holes 82. In the same manner, a plurality of longitudinal slots 94 are provided at each end of cover 90 on opposite sides of holes 92. The rotation of shaft 62 and the orientation of the blades carried by propellers 64 and 66 are selected such that when shaft 62 is rotated by electrical motor 60, air will be drawn inwardly through holes 82 in cover 80 and holes 92 in cover 90. The air is exhausted from slots 84 at each end of cover 80 and slots 94 at each end of cover 90. Slots 84 are preferably aligned with fins 46 of heat exchanger 40. Thus, electrical motor 60 rotating shaft 62, propellers 64 and 66 cooperate with covers 80 and 90 to provide the optimum air circulation flow path with respect to fins 46 of heat sink 40 and fins 56 of heat sink 50. The preferred air circulation flow path is shown in FIG. 3 of the drawings. A portion of the air flow path is generally normal to the heat transfer surfaces associated with heat sinks 40 and 50 and hot side 36 and cold side 38 respectively. Another portion of the air flow path is parallel with fins 46 and 56 of heat sinks 40 and 50 respectively. Insulating layer 42 cooperates with heat sink 40 and opening 26 to prevent undesired mixing of the air circulated by propellers 64 and 66 respectively.

A thermoelectric assembly incorporating the present invention can function satisfactorily without covers 80 and/or 90. The use of covers 80 and/or 90 enhances the efficiency of the assembly. Modular thermoelectric assembly 130 is shown in FIG. 4 without covers 80 and 90.

As shown in FIGS. 2, 3 and 4, electrical motor 60 and rotating shaft 62 are preferably disposed adjacent to thermoelectric device 32. This location for electrical motor 60 and rotating shaft 62 allows propellers 64 and 66 to force air to directly contact heat the transfer surfaces associated with hot side 36 and cold side 38 of thermoelectric device 32. This direct impingement of air, particularly from propeller 64 onto the heat transfer surfaces associated with hot plate 36, has substantially increased the efficiency of thermoelectric device 32.

For some applications, it may not be required to install both propellers 64 and 66. Depending upon the amount of heat which will be transferred by the specific modular thermoelectric assembly, either propeller 64 or 66 may be eliminated. Also, impellers could be used to replace propellers 64 and/or 66 if desired. For some applications, electrical motor 60 and rotating shaft 62 may not be required. For these applications, the natural convection of air over heat sinks 40 and 50 would be used to provide the desired heat transfer with the surrounding environment. In a natural convection design, heat sink 50 may be finless and may line part or all of the enclosure.

Since the present invention results in a compact modular thermoelectric assembly of heat sinks, insulating material, thermoelectric device, electrical motor and propellers, the modular thermoelectric assembly may be installed on the top, bottom, side, front or any other desired portion of an enclosed structure or container. The only requirement is that the opening in the container have a geometric configuration which matches the configuration of the heat sinks and insulating layer used to manufacture the specific thermoelectric assembly. Also, the present invention may be used with other DC, internal or external, power supplies and is not limited to 12 volt DC power.

FIG. 5 illustrates a perspective view of a second embodiment of a module 200 and a thermoelectric refrigerator 202 constructed in accordance with the teachings of the present invention. Although module 200 is illustrated for use in thermoelectric refrigerator 202, module 200 may be used with any enclosed structure for heating or cooling without departing from the scope and teachings of the present invention.

Module 200 includes a thermoelectric assembly 204 similar to that of modular thermoelectric assembly 130 illustrated in FIG. 4. In the embodiment illustrated in FIG. 5, thermoelectric assembly 204 comprises heat sink 40, heat sink 50, propeller 64, a second propeller (not explicitly shown), insulating layer 42, an electric motor (not explicitly shown), a rotating shaft (not explicitly shown) and a thermoelectric device (not explicitly shown). Insulating layer 42 is preferably resilient and can be, for example, made of rubber or other suitable elastomeric material. Heat sink 40 in this embodiment has a flange portion (244, shown in FIG. 7) on either side of heat sink 40 for use in mounting thermoelectric assembly 204 in module 200.

Thermoelectric assembly 204 mounts in module 200 in the illustrated embodiment by sliding the flange portions of heat sink 40 onto heat sink mounting members 208 on platform 212. After thermoelectric assembly 204 slides into place on heat sink mounting members 208, it may be affixed to platform 212 using screws, brackets, or any other type of mounting device. Mounting members 208 could serve as fasteners for thermoelectric assembly 204 using a locking mechanism to snap the flanges (244, shown in FIG. 7) of heat sink 40 into position after they have slid on mounting members 208. Other fastening mechanisms will be apparent to those skilled in the art and could be used without departing from the scope and teachings of the present invention.

Figure 6:
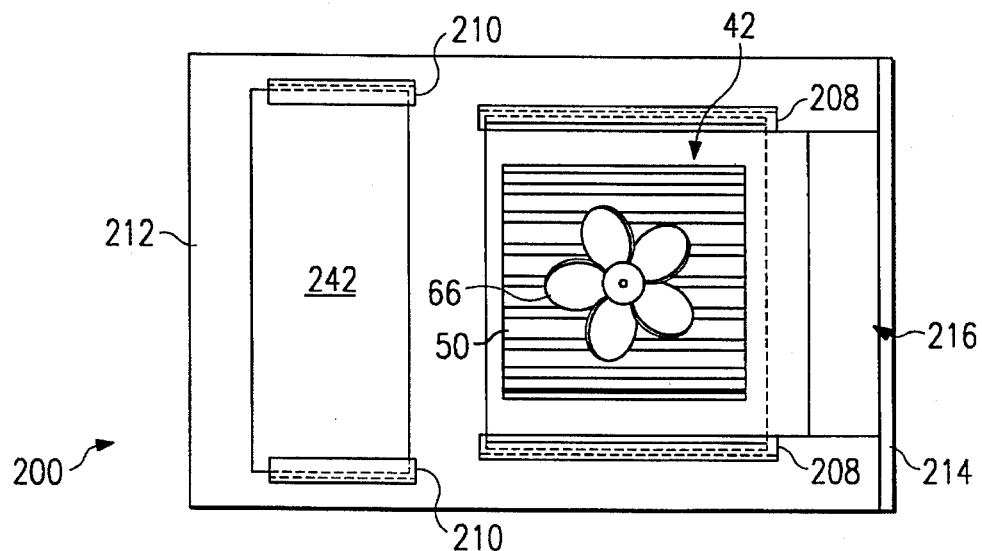
FIG. 6 illustrates a bottom view of the module of FIG. 5.
Figure 8:
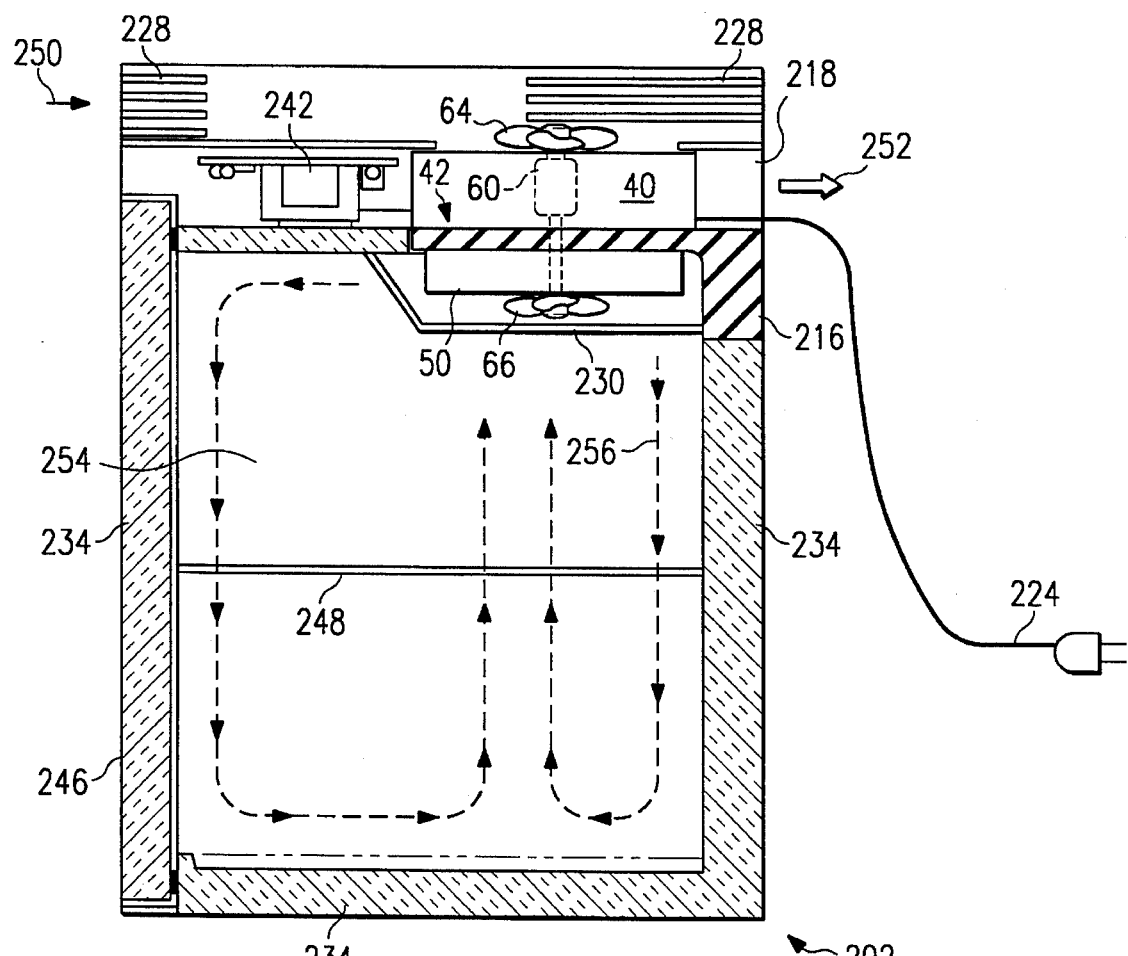
FIG. 8 illustrates a cutaway side view of the thermoelectric refrigerator of FIG. 5 with the module of FIG. 5 inserted.

Module 200 also includes power supply mounting members 210 for mounting a power supply (242, shown in FIGS. 6 & 8). The power supply may also be connected by sliding a flange on the power supply into power supply mounting members 210 and fixing the power supply in position with a screw, bracket, or other mounting device.

Platform 212 is preferably coupled to panel 214. In the embodiment illustrated in FIG. 5, panel 214 is substantially perpendicular to platform 212. Rear seal portion 216 of insulating layer 42 couples to panel 214.

Panel 214 includes a plurality of openings 218 that ventilate air passing over the surface of heat sink 40. Panel 214 also may include holes 220 that may be used to mount module 200 to thermoelectric refrigerator 202. Panel 214 may also include a notch 222 to allow power cord 224 to exit from thermoelectric assembly 204. Power cord 224 couples to the power supply (242, shown in FIGS. 6 & 8) for thermoelectric assembly 204. In the embodiment illustrated in FIG. 5, power cord 224 may be run between one or more fingers of heat sink 40 or along the side of heat sink 40 to be connected to the power supply (242, shown in FIGS. 6 & 8).

Thermoelectric refrigerator 202 may be box shaped and may include a module opening 226 for receiving module 200. Vents 228 may also be formed in enclosed structure or refrigerator 202 to allow communication of air with module 200. When module 200 is inserted into opening 226, vents 228 may ventilate heat sink 40 while module 200 operates. Thermoelectric refrigerator 202 also includes molded grill 230 to allow air contained within refrigerator 202 to circulate through the refrigerated compartment (not explicitly shown) of thermoelectric refrigerator 202 and over the surface of heat sink 50 in response to propeller 66. Molded grill 230 prevents a user of thermoelectric refrigerator 202 from coming into contact with propeller 66.

In this way two separate air flow paths may be created. One path may allow air to circulate over the surface of heat sink 40 via vents 228 and openings 218. Another path may allow air to circulate over the surface of heat sink 50 and through the refrigerated compartment of thermoelectric refrigerator 202.

Thermoelectric refrigerator 202 also may include guide members 232, insulation 234, ledge 236 and frontal mold 238. Guide members 232 may be slightly angled to aid in compressing insulating layer 42 when module 200 is inserted into thermoelectric refrigerator 202. Module 200 may be engaged slidingly and removably with thermoelectric refrigerator 202 by sliding platform 212 into the slots in guide members 232. When module 200 is inserted into thermoelectric refrigerator 202, the bottom of insulating layer 42 rests on ledge 236. Insulating layer 42 seals the top portion of thermoelectric refrigerator 202. Rear seal portion 216 of insulating layer 42 rests against frontal mold 238 to seal and insulate the rear of thermoelectric refrigerator 202. Insulation 234 insulates the interior of thermoelectric refrigerator 202. Mounting bolts 237 may be used to attached module 200 to thermoelectric refrigerator 202. Mounting bolts 237 pass through holes 220 and may be inserted in threaded holes 239.

FIG. 6 illustrates a bottom view of module 200, and illustrates rear seal portion 216 of insulating layer 42. Power supply 242, as discussed above, slides into power supply mounting members 210.

FIG. 7 illustrates a rear cutaway view of module 200 while inserted into thermoelectric refrigerator 202. This view illustrates among other features how openings 218 ventilate heat sink 40. FIG. 7 also illustrates how platform 212 slides into guide members 232 and how flange portions 244 of heat sink 40 slide into heat sink mounting members 208. Gasket 206 sealingly engages against insulation 234, thus sealing off the upper portion of thermoelectric refrigerator 202 to establish the two separate air flow paths.

FIG. 8 illustrates a side view of thermoelectric refrigerator 202 with module 200 inserted. Thermoelectric refrigerator 202 also includes door 246 and adjustable shelf 248. FIG. 8 illustrates the operation of thermoelectric refrigerator 202.

In the embodiment illustrated in FIG. 8, heat sink 40 is ventilated by vents 228 and openings 218 defining one air flow path. In this embodiment, intake air is drawn into vents 228 as illustrated by arrow 250 in response to propeller 64. The air is drawn down over the surface of heat sink 40 and exits as exhaust air through openings 218 as illustrated by the direction of arrow 252. Depending upon the design and direction of rotation of propeller 64, intake air could be drawn through openings 218 and exhaust air could exit thermoelectric refrigerator 202 through vents 228.

Similarly, in the enclosed structure forming the cooled compartment 254 of thermoelectric refrigerator 202, propeller 66 causes air to pass over the surface of heat sink 50 and circulate throughout compartment 254 in the direction shown by arrows 256, forming another air flow path. Air passes through openings in molded grill 230. Alternatively, depending upon the design and direction of rotation of propeller 66, air could flow in the opposite direction in compartment 254.

Power supply 242 can be coupled to an on/off switch and/or a thermostat (not explicitly shown). The on/off switch may be used to turn thermoelectric refrigerator 202 on and off while a thermostat may be used to control the temperature in compartment 254 by turning thermoelectric device 32 on and off in response to the thermostat. In the embodiment illustrated in FIG. 8, power supply 242 has an AC to DC convertor and drives thermoelectric device 32 with DC power.

The surface area of vents 228 should be sufficiently large to allow enough air to pass over heat sink 40 to cool it sufficiently. In the embodiment illustrated in FIG. 8, vents 228 have a surface area approximately 75% as large as a circle having approximately the same circumference as propeller 64. Sufficient open space above propeller 64 may advantageously be included to allow air to sufficiently circulate over the surface of heat sink 40, or flow into propeller 64.

Although the present invention and its advantages have been described in detail, it should be understood that various changes, substitutions and alterations can be made without departing from the spirit and scope of the invention as defined by the following claims.

What is claimed is:

1. A module for controlling the temperature within an enclosed structure comprising:
   a thermoelectric assembly having
      a thermoelectric device with a first heat sink disposed on one side of the device and a second heat sink disposed on the other side of the device,
      an electrical motor attached to one of the heat sinks with a rotating shaft extending longitudinally through the electrical motor and both heat sinks,
      a first propeller attached to a first end of the rotating shaft adjacent to the first heat sink;
   a platform operable to removably engage with the structure, the platform having a first fastener and a first opening, the first fastener operable to mount the thermoelectric assembly to the platform, the first opening disposed adjacent to one of the propellers; and a panel attached to the platform.

2. The module of claim 1, further comprising:

a resilient gasket coupled to one of the heat sinks and operable to sealingly engage with the structure;

a second propeller attached to a second end of the rotating shaft adjacent to the second heat sink;

wherein the platform slidably engages with the structure; and wherein the panel has a second opening, the second opening operable to ventilate one of the heat sinks.

3. The module of claim 1, wherein the panel comprises a second opening, the second opening operable to ventilate one of the heat sinks.

4. The module of claim 1 wherein the platform slidably engages with the structure.

5. The module of claim 1, the platform comprises a second fastener to receive a power supply.

6. The module of claim 1, further comprising insulation material attached to the platform for insulating the structure.

7. The module of claim 1, further comprising a second propeller attached to a second end of the rotating shaft adjacent to the second heat sink.

8. A thermoelectric refrigerator comprising:

a box having a module opening and at least one module receiving member; and a module, the module including (1) a thermoelectric assembly having a thermoelectric device with a first heat sink disposed on one side of the device and a second heat sink disposed on the other side of the device, an electrical motor attached to one of the heat sinks with a rotating shaft extending longitudinally through the electrical motor and both heat sinks, and a propeller attached to each end of the rotating shaft adjacent to the first heat sink and the second heat sink respectively;

(2) a platform operable to removably engage the module receiving member, the platform having a first fastener and a first opening, the first fastener operable to fasten the thermoelectric assembly to the platform, the first opening disposed adjacent to one of the propellers; and (3) a panel attached to the platform.

9. The thermoelectric refrigerator of claim 8 wherein the platform slidably engages with the module receiving member.

10. The thermoelectric refrigerator of claim 8 wherein the insulated box further comprises a top and a plurality of sides substantially perpendicular to the top and at least one intake opening in one of the sides for supplying air to one of the propellers.

11. The thermoelectric refrigerator of claim 8 wherein said box further comprises a compartment adjacent to said module opening; and wherein said thermoelectric refrigerator further comprises a door to control access to said compartment.

12. The thermoelectric refrigerator of claim 8 wherein one of the propellers is operable to circulate air within the insulated box.

13. The thermoelectric refrigerator of claim 8 wherein the module further comprises a resilient gasket coupled to one of the heat sinks and operable to sealingly engage with the insulated box.

14. The thermoelectric refrigerator of claim 8 wherein the panel has a second opening, the second opening operable to ventilate one of the heat sinks.

15. The thermoelectric refrigerator of claim 10 wherein one of the propellers is operable to circulate air in an air flow path within the interior of the insulated box and over the surface of one the heat sinks.

16. The thermoelectric refrigerator of claim 14 wherein the platform slidably engages with the module receiving member.

17. A method of making a module for controlling the temperature within an enclosed structure comprising:

forming a thermoelectric assembly having a thermoelectric device with a first heat sink disposed on one side of the device and a second heat sink disposed on the other side of the device, an electrical motor attached to one of the heat sinks with a rotating shaft extending longitudinally through the electrical motor and both heat sinks, a propeller attached to each end of the rotating shaft adjacent to the first heat sink and the second heat sink respectively;

fastening the thermoelectric assembly to a platform having a first opening therein, the first opening adjacent to one of the propellers of the fastened thermoelectric assembly;

attaching a panel to the platform; and attaching the panel and the platform to the structure through a second opening in the structure, the second opening for receiving the thermoelectric assembly.

18. The method of claim 17 further comprising the steps of:

providing the thermoelectric assembly with a resilient gasket coupled to one of the heat sinks; and sealingly engaging the resilient gasket with the structure.

19. The method of claim 17 wherein the attaching step further comprises removably attaching the panel and the platform by slidingly engaging the platform with the structure.

20. The method of claim 17 further comprising the step of slidingly engaging the platform with the structure.

21. The method of claim 17 further comprising the step of providing a first air flow path to circulate air over the surface of the first heat sink.

22. The method of claim 17 further comprising the step of providing a second air flow path to circulate air over the surface of the second heat sink and within a compartment of the enclosed structure.

* * * * *

UNITED STATES PATENT AND TRADEMARK OFFICE
CERTIFICATE OF CORRECTION

PATENT NO. : 5,501,076
DATED : March 26, 1996
INVENTOR(S) : Sharp, III et al.

It is certified that error appears in the above-indentified patent and that said Letters Patent is hereby corrected as shown below:

Title page; Item [21] delete "344,140" and insert -- 344,740 --.

Signed and Sealed this

Eleventh Day of June, 1996

Attest:

BRUCE LEHMAN

*Attesting Officer*  *Commissioner of Patents and Trademarks*